(12) United States Patent
Nishimori

(10) Patent No.: US 7,990,207 B2
(45) Date of Patent: Aug. 2, 2011

(54) CONSTANT VOLTAGE CIRCUIT, CONSTANT VOLTAGE SUPPLY SYSTEM AND CONSTANT VOLTAGE SUPPLY METHOD

(75) Inventor: Eiji Nishimori, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 141 days.

(21) Appl. No.: 12/115,934

(22) Filed: May 6, 2008

(65) Prior Publication Data
US 2009/0146729 A1 Jun. 11, 2009

(30) Foreign Application Priority Data

May 7, 2007 (JP) ................................. 2007-122536

(51) Int. Cl.
*G05F 1/10* (2006.01)
*G05F 3/02* (2006.01)
(52) U.S. Cl. ........................ 327/543; 327/539
(58) Field of Classification Search .......... 327/538–540, 327/543
See application file for complete search history.

(56) References Cited

U.S. PATENT DOCUMENTS

| | | | | |
|---|---|---|---|---|
| 4,064,506 A * | 12/1977 | Cartwright, Jr. | ............... | 341/135 |
| 5,124,632 A * | 6/1992 | Greaves | ........................ | 323/316 |
| 5,892,390 A * | 4/1999 | Tobita | ............................ | 327/543 |
| 5,933,029 A * | 8/1999 | Kuroda et al. | ................... | 326/86 |
| 5,949,278 A * | 9/1999 | Oguey | ............................ | 327/543 |
| 6,710,641 B1 * | 3/2004 | Yu et al. | .......................... | 327/539 |
| 6,724,176 B1 * | 4/2004 | Wong et al. | .................... | 323/316 |
| 6,914,475 B2 * | 7/2005 | Enriquez et al. | ............... | 327/539 |
| 6,919,743 B2 * | 7/2005 | Tobita | ............................ | 327/108 |
| 7,332,965 B2 * | 2/2008 | Seth et al. | ....................... | 330/288 |
| 7,471,138 B1 * | 12/2008 | Shen | ............................... | 327/541 |
| 7,675,353 B1 * | 3/2010 | Mack | .............................. | 327/539 |

OTHER PUBLICATIONS

Phillip E. Allen et al., "CMOS Analog Circuit Design", Second Edition, New York Oxford, Oxford University Press 202, p. 425.

* cited by examiner

*Primary Examiner* — Quan Tra
(74) *Attorney, Agent, or Firm* — Fujitsu Patent Center

(57) ABSTRACT

An input voltage signal VIN to be inputted to a gate terminal of a PMOS transistor M1 is converted to a voltage value which was level shifted at the source terminal by an inter-terminal voltage between the gate and source of the PMOS transistor M1. This conversion is carried out in accordance with a bias current I1 flowing from the constant current source IS through the source terminal of the PMOS transistor M1. The voltage thus converted is outputted from a source follower circuit through a capacitative element C1. A low-pass filter is constituted of the impedance of the PMOS transistor M1 and the capacitative element C1 in a signal path extending from the input voltage signal VIN to the source follower circuit.

14 Claims, 2 Drawing Sheets

CIRCUIT DIAGRAM OF EMBODIMENT

PRINCIPLE DIAGRAM OF DISCLOSURE

CIRCUIT DIAGRAM OF EMBODIMENT

CIRCUIT DIAGRAM OF RELATED ART

CONSTANT VOLTAGE CIRCUIT, CONSTANT VOLTAGE SUPPLY SYSTEM AND CONSTANT VOLTAGE SUPPLY METHOD

CROSS-REFERENCE TO RELATED APPLICATIONS

This application is based upon and claims the benefit of priority from the prior Japanese Patent Application No. 2007-122536 filed on May 7, 2007, the entire contents of which are incorporated herein by reference.

BACKGROUND

1. Field

The disclosure relates to output of a constant voltage, and more particularly, it relates to a constant voltage circuit, a constant voltage supply system and a constant voltage supply method in which a transient fluctuation in voltage caused by a fluctuation in the input voltage is suppressed.

2. Description of Related Art

With the development of integrated circuit technology, progresses are made in the miniaturization of circuit elements constituting highly integrated circuits such as SOC, which have a plurality of functions mounted onto one chip. In this context, withstand voltage restrictions of circuit elements require lower applied voltage. These restrictions also require that no transient overshoots of a voltage value occur and that a voltage having a stable value is outputted to thereby ensure a high-speed operation. Generally, this applied voltage is obtained by converting an external supply voltage which is supplied from exterior into an internal voltage having a stable constant voltage value, and is then supplied.

Such a related technology is disclosed in "CMOS Analog Circuit Design", by Phillip E. Allen and Douglas R. Holberg, (US), Second Edition, Oxford UNIVERSITY PRESS, 2002, p. 425.

SUMMARY

One aspect of an embodiment includes providing a constant voltage circuit comprising: an input transistor that receives an input voltage signal at a gate terminal; a constant current source that outputs a bias current with respect to either an emitter terminal or a source terminal of the input transistor; a capacitative element having one terminal coupled to a path that couples the input transistor and the constant current source; and a source follower circuit that receives a voltage signal generated at one terminal of the capacitative element. The above and further novel features of the disclosure will more fully appear from the following detailed description when the same is read in connection with the accompanying drawings. It is to be expressly understood, however, that the drawings are for the purpose of illustration only and are not intended as a definition of the limits of the disclosure.

DETAILED DESCRIPTION OF THE PREFERRED EMBODIMENTS

Figure 3:
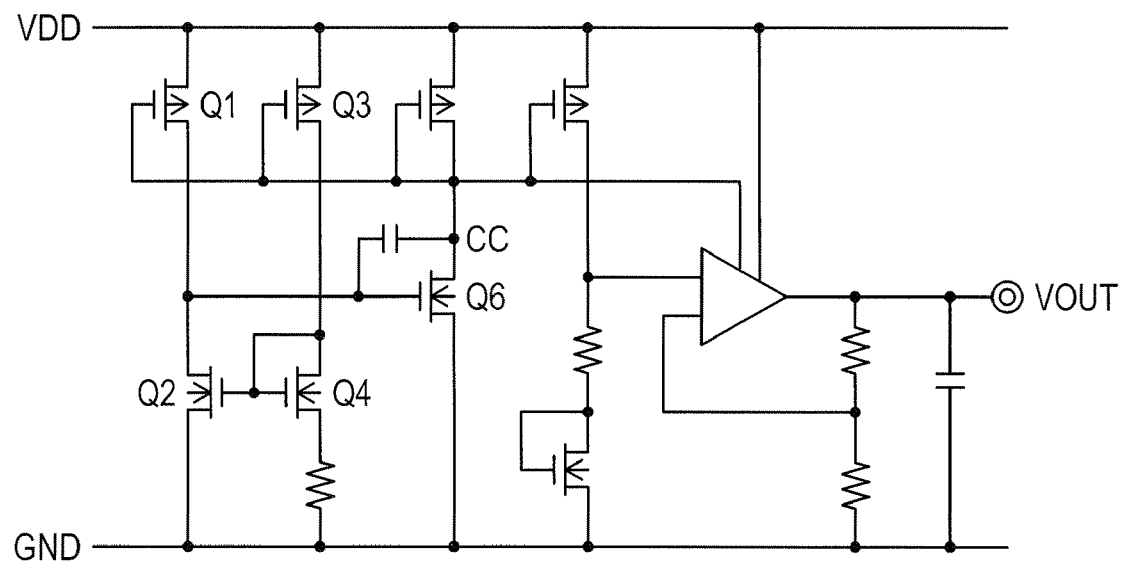
FIG. 3 is a circuit diagram showing related art.

One example of a voltage conversion circuit that converts an external supply voltage into an internal voltage includes a circuit that employs a bandgap reference circuit. The bandgap reference circuit determines a current by applying a voltage in accordance with a transistor surface ratio (in a MOS transistor, channel width (W)/channel length (L)) to a resistive element having a predetermined resistance value. The exterior supply voltage is thus used as a power source voltage, whereby a high-accuracy internal voltage can be easily obtained. FIG. 3 shows a example. Here, the case in which a MOS transistor is used is taken as example. A pair of MOS transistors Q2 and Q4 having a current mirror circuit configuration have current mirror circuits Q1 and Q3 that pass the same electric current and a MOS transistor Q6 which is a feedback circuit that applies a feedback to change a current to a target current. A capacitative element CC is provided between a gate terminal and drain terminal of the MOS transistor Q6 to counter oscillation. The voltage conversion circuit employing a bandgap reference circuit can ensure an accurate output voltage. However, if the exterior supply voltage to be inputted to the bandgap reference circuit (the power source voltage) suddenly fluctuates, the capacitative element CC connected between the gate terminal and drain terminal of the MOS transistor Q6 to counter oscillation is charged and discharged. Thus, the inter-terminal voltage requires a predetermined period of time to converge with a voltage value in accordance with the power source voltage. During this time, the circuit state becomes unstable, which may thus cause an overvoltage to occur in the output voltage. This overvoltage is likely to cause breakdown of circuit elements depending on the withstand voltage of later stage circuits. Thus, this may damage the reliability of circuit elements. In particular, in recent highly-integrated circuits, if a bias current is set to a low current value, charge/discharge of the capacitative element CC controls the operation of the circuit. This is likely to cause the occurrence of a noticeable overvoltage.

Figure 1:
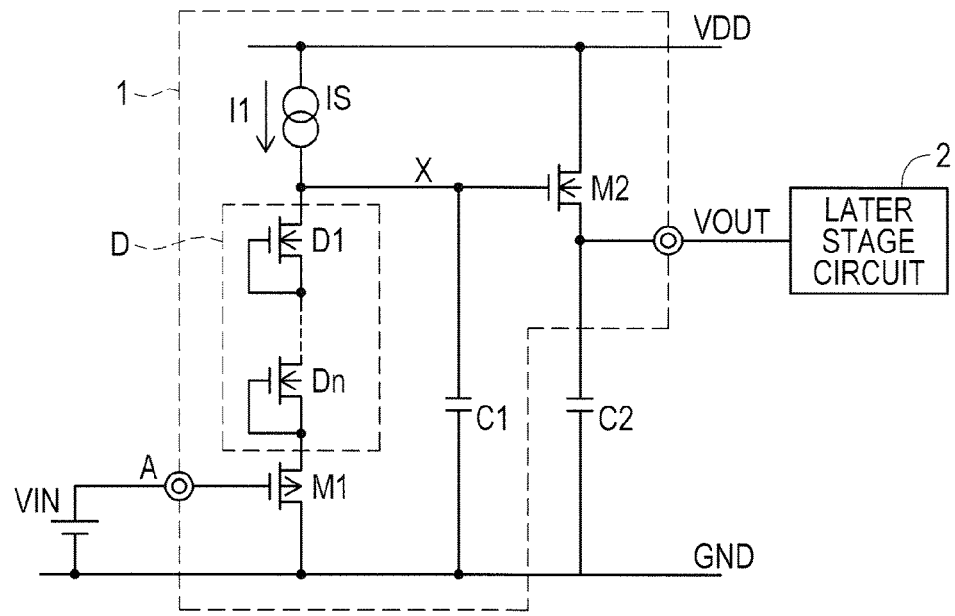
FIG. 1 is a diagram according to the disclosure.

FIG. 1 is a diagram according to the disclosure. A voltage conversion unit 1 has an input terminal A and an output terminal VOUT. A voltage supply unit VIN is connected to the input terminal A and inputs an input voltage signal VIN thereto. A later stage circuit 2 is connected to the output terminal VOUT.

The configuration of the voltage conversion unit 1 will now be described. A PMOS transistor M1 has a gate terminal connected to the input terminal A and a drain terminal connected to a ground voltage GND. At the same time, the PMOS transistor M1 has a source terminal connected to one terminal of a constant current source IS to make a current path formed between its source terminal and one terminal of a constant current source IS. Here, the other terminal of the constant current source IS is connected to a source voltage VDD.

One terminal of the constant current source IS is connected to a gate terminal of a NMOS transistor M2 constituting a source follower circuit. At the same time, a capacitative element C1 is connected between the one terminal of the constant current source IS and the ground voltage GND. Symbol X in FIG. 1 represents a connection point. The NMOS transistor M2 has a drain terminal connected to the power source voltage VDD, and a source terminal connected to the output terminal VOUT. A capacitative element C2 is connected between the output terminal VOUT and the ground voltage GND.

The PMOS transistor M1 and the connection point X may be directly connected to each other. Otherwise, a diode unit D may be inserted between the PMOS transistor M1 and the connection point X. The diode unit D is composed of diodes D1 through Dn which are connected in series in multi stages.

Diodes D1 through Dn are each composed of a NMOS transistor having their drain terminal connected to their gate terminal.

A bias current I1 generated by the constant current source IS is flown to a source terminal of the PMOS transistor M1. As a result, an input voltage signal VIN to be inputted to the input terminal A is outputted to the source terminal. This input voltage signal is obtained by adding thereto an inter-terminal voltage VGS between the gate terminal and the source terminal of the PMOS transistor M1, and then performing a level conversion thereon. Further, in case of a diode unit D, a forward voltage is added to the input voltage signal in accordance with the number of stages of the diode after which a level conversion is performed thereon. As a result, a voltage having a voltage level that was shifted up at the connection point X is outputted. Since a NMOS transistor connected to a diode is used as a diode in FIG. 1, the forward voltage of the diode becomes the inter-terminal voltage VGS between the gate terminal and the source terminal of the NMOS transistor. If the diode is an n-stage diode, the voltage signal VX becomes:

$$VX=VIN+(n+1)\cdot VGS$$

It is to be noted, of the above expression for this diode, $(n+1)\cdot VGS$ is made together with that of the PMOS transistor M1.

The voltage signal VX at the connection point is inputted to the gate terminal of the NMOS transistor M2. Since the NMOS transistor M2 constitutes a source follower circuit, the output voltage VOUT to be outputted to the output terminal VOUT which is connected to the source terminal becomes:

$$VOUT=VIN+n\cdot VGS$$

Here, consideration is given to the influence on the output voltage VOUT in the case a transient rise occurs in the input voltage signal VIN outputted from the voltage supply unit VIN.

This rise in the input voltage signal VIN causes the PMOS transistor M1 to be biased towards a cut-off state. In other words, a lower inter-terminal voltage between the gate and the source results in a lower drain current ID, in accordance with a square-law characteristic of the drain current ID with respect to the inter-terminal voltage VGS between the gate and source of the MOS transistor. This obstructs the current flow and at the same time, causes an increase in the impedance ($\Delta VGS/\Delta ID$) of the drain current with respect to the inter-terminal voltage VGS between the gate and the source. The square-law characteristic of the MOS transistor applies in a similar manner to the diodes D1 through Dn that constitute the diode unit D. Thus, in the case of the diodes D1 through Dn as well, the forward current drops and at the same time, the impedance increases.

The current flowing from the diode unit D through the PMOS transistor M1 is restricted. Thus, the rest of the bias current I1 outputted from the constant current source IS flows to the capacitative element C1, whereby the capacitative element C1 is charged. If a relationship between the value of the bias current I1 and a capacitance value of the capacitative element C1 during the transient rise in the input voltage signal VIN is selected, an increase in the voltage of the voltage signal VX at connection point X can be suppressed to a minimum level.

A low-pass filter can also be provided in a propagation path of the voltage signal extending from the input terminal A to the connection point X. This can be realized because the impedance of the PMOS transistor M1 and the respective diodes D1 through Dn, and the capacitative element C1 are connected in series. As a result, a propagation having sharp fluctuations is blocked off by the lowpass-filter with respect to a transient rise in the input voltage signal VIN which is inputted to the input terminal A.

For instance, let us assume the bias current I1 is restricted to 10 nA due to power saving requirements in highly integrated circuits, the transient rise time for the input voltage signal VIN is 10 μsec, and a capacitance value of the capacitative element C1 is 1 pF. In this case, from the expression $t=C1\cdot \Delta VX/I1$, which represents the relationship between the capacitative element C1 and the voltage signal VX at the connection point X, $$\Delta VX=t\cdot I1/C1=10(\mu sec)\cdot 10(nA)/1(pF)=0.1V$$

During the 10 μsec transient rise time of the input voltage signal VIN, the fluctuation range ($\Delta VX$) of the voltage signal VX at the connection point X can be suppressed to approximately 0.1V. More specifically, the fluctuation range of the output voltage VOUT can be held to approximately 0.1V.

Thus, it can be understood that the capacitance value of the capacitative element C1 which is required to suppress propagation of the input voltage signal VIN to an output voltage VOUT which experiences a transient rise in voltage is sufficient at a minimum capacitance value in the order of picofarad (pF), in accordance with the transient rise time of the input voltage signal VIN and the bias current I1. Specifically, if the bias current I1 is set to a low current value due to the requirement for low consumption current in the highly integrated circuits, the capacitance value of the capacitative element C1 can be reduced. In addition, the capacitative element C1 can be added in the integrated circuit without the need to provide any special arrangement area.

Thus, a small-sized capacitative element C1 is provided in the constant voltage circuit that has a PMOS transistor M1 and is adapted to output the input voltage signal VIN while performing a level conversion thereon. As a result, the capacitative element can form, together with the impedance of the PMOS transistor, a low pass filter. The low-pass filter can block off a transient rise in voltage in the input voltage signal VIN thereby suppressing fluctuations in the output voltage VOUT.

In this case, by providing a diode unit D between the PMOS transistor M1 and the connection point X, the impedance between the input terminal A and the connection point X can be increased even more, thereby further strengthening the low-pass filter characteristic. As a result, fluctuations in the output voltage VOUT can be suppressed.

Here, the capacitative element C2 connected between the output terminal VOUT and the ground voltage GND is effective in the case the input voltage signal VIN experiences a transient drop in voltage. In this case, the PMOS transistor M1 is unlikely to approach a cutoff state. Also, if the low-pass filter constituted of the PMOS transistor M1 and the capacitative element C1 is not functional, provision of this capacitative element C2 can help maintain the output voltage VOUT at a predetermined voltage value.

The voltage conversion unit 1, or the voltage conversion unit 1 and the voltage supply unit VIN correspond to the constant voltage circuit of the present application. The voltage conversion unit 1 and the voltage supply unit VIN correspond to the constant voltage supply system of the present application.

The principle diagram in FIG. 1 shows the case that inter-terminal voltage VGS between the gate terminal and source terminal of the PMOS transistor M1 is added to the input voltage signal VIN. The above description concerns the case that the output voltage VOUT is maintained at a predetermined voltage even in the event of a transient rise in voltage in the input voltage signal VIN.

However, the present application is not limited to this case. For instance, a configuration can thus be obtained wherein the inter-terminal voltage VGS between the gate terminal and the source terminal of the MOS transistor is subtracted from the input voltage signal VIN and the output voltage VOUT is maintained at a predetermined voltage even in the event of a transient drop in voltage in the input voltage signal VIN.

A NMOS transistor may be used in place of the PMOS transistor M1 and a constant current source may be connected, in place of the constant current source IS, to output a bias current from the source terminal of the NMOS transistor. This makes it possible to set the voltage signal VX at a connection point X to a voltage value obtained by subtracting the inter-terminal voltage VGS from the input voltage signal VIN.

Figure 2:
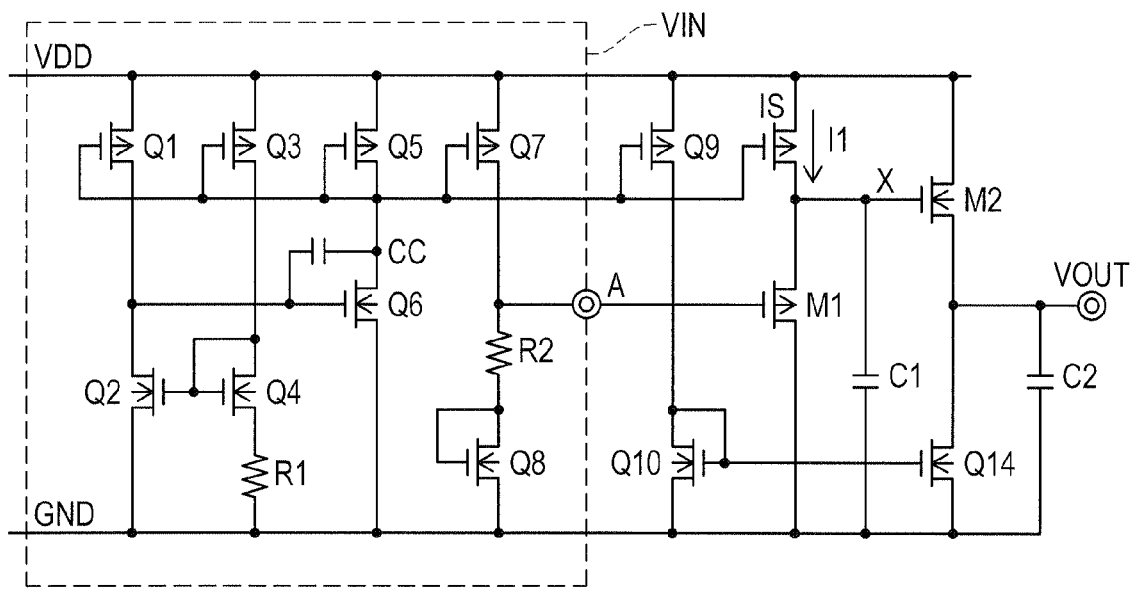
FIG. 2 is a circuit diagram showing an embodiment of the disclosure.

FIG. 2 is a circuit diagram according to an embodiment. Elements which correspond to those in the principle diagram of FIG. 1 are denoted by the same numerical symbols and further description thereof is hereby omitted. In this embodiment, a description will be given of the case that the diode unit D as shown in the principle diagram of FIG. 1 is not provided. In the embodiment of FIG. 2, a bandgap reference circuit is used as the voltage supply unit VIN.

The bandgap reference circuit VIN has the same circuit configuration as the bandgap reference circuit shown in the related technology in FIG. 3.

A pair of NMOS transistors Q2 and Q4 having a current mirror circuit configuration are connected to PMOS transistors Q1 and Q3 that constitute a current mirror circuit and flow the same current. A NMOS transistor Q6 is also provided and constitutes a return circuit that applies a return through the PMOS transistor Q5 so that the current value reaches a target value. The PMOS transistor Q5 constitutes a current mirror circuit together with the PMOS transistors Q1 and Q3. A capacitative element CC is provided between the gate terminal and the drain terminal of the NMOS transistor Q6 to counter oscillations. The current mirror circuit constituted of PMOS transistors Q1 and Q3 further includes a PMOS transistor Q7. The PMOS transistor Q7 is connected to a ground voltage GND through a resistive element R2 and a NMOS transistor Q8 which is connected to a diode. The connection point between the PMOS transistor Q7 and the resistive element R2 is the output terminal of the bandgap reference circuit VIN, and in shown at input terminal A in FIG. 1.

The PMOS transistor Q9 is included in a current mirror circuit composed of PMOS transistors Q1, Q3, Q5 and Q7. Of the NMOS transistors Q10 and Q14 that constitute a current mirror circuit, the PMOS transistor Q9 is connected to the NMOS transistor Q10 which is connected to a diode. The NMOS transistor Q14 is connected to the output terminal VOUT.

In this circuit configuration, when the power source voltage fluctuates sharply, the inter-terminal voltage fluctuates in accordance with these fluctuations. As a result, the capacitative element CC provided to counter the oscillations of the NMOS transistor Q6 that constitutes a return circuit is charged or discharged. If the value of the current to be outputted from the current mirror circuit is small, charging or discharging of the capacitative element CC requires a predetermined period of time. During this time, the inter-terminal voltage of the capacitative element CC is in a transient state, which leads to an unstable state. As a result of this, the output terminal (terminal A) of the bandgap reference circuit VIN may experience transient increases in voltage, which may cause an overvoltage.

In this embodiment, this overvoltage is applied to terminal A and is inputted to the voltage conversion unit 1 shown in FIG. 1. Thus, the voltage applied to terminal A does not cause the output voltage VOUT to fluctuate. As a result, the output voltage VOUT can be maintained at a constant voltage with respect to a transient fluctuation in voltage in the bandgap reference circuit VIN.

Normally, a bandgap reference circuit is used which has minimum temperature dependence and superior voltage accuracy. Thus, the output voltage VOUT can be maintained at a predetermined voltage with high accuracy, even in the case that the bandgap reference voltage VIN changes to a transient overvoltage due to a transient response in the bandgap reference circuit.

Recently, some integrated circuits include logical circuits which do not require high-speed response, such as sensor for detecting an abnormal state or real time clocks or the like which are mounted in a digital device and which are employed as a clock function. Such logical circuits require extremely low power consumption due to the fact that they do not require high-speed operation, and in addition, require the ability for long time backups by using a battery or capacitors or the like, due to low power consumption. Also, miniaturization which is obtained by high integration of circuits demands lower withstand voltage for the elements constituting these circuits. Thus, application of an overvoltage is likely to cause damage.

As was described in the foregoing text, in the disclosure, a configuration can be obtained in which the low-pass filter characteristic can be sufficiently realized by setting the bias current I1 to a low current. In other words, when the bandgap reference voltage experiences an overvoltage, the current flowing through the PMOS transistor M1 is restricted. Thus, a high percentage of the bias current I1 which is outputted from the constant current source IS flows to the capacitative element C1. However, since the bias current I1 is a low current, the voltage fluctuations at the connection point X which are caused by a charge operation with respect to the capacitative element C1 are restricted to small fluctuations.

A highly integrated circuit is preferably configured so that an applied voltage is supplied from the constant voltage circuit of this embodiment with respect to a circuit, such as a sensor or a real time clock or the like, which is constituted of miniaturized elements having a low withstand voltage and requires a low power consumption. As a result, a voltage having a good voltage accuracy, such as the voltage of a bandgap reference circuit or the like, is used as an input voltage signal and the voltage level is shifted by a conduction control voltage of the transistor element. With such a circuit configuration, a low-pass filter effect can be realized in the signal propagation path, with respect to the input voltage signal by simply providing a capacitative element. A constant voltage can thus be maintained even with respect to transient fluctuations in the input voltage signal, while the output voltage is maintained at the constant voltage with high accuracy. This helps prevent application of overvoltage to later stage circuits.

In this case, provision of the diode unit D shown in FIG. 1 makes it possible to maintain the output voltage VOUT at a constant voltage even with respect to transient fluctuations in the bandgap reference voltage that may last for longer periods of time.

Since the capacitative element C2 is provided between the output terminal VOUT and the ground voltage GND, the output voltage VOUT can be maintained at a constant voltage even in the event the bandgap reference voltage has experienced a transient drop.

As was described in detail in the foregoing text, according to the constant voltage circuit, the constant voltage supply system and the constant voltage supply method of the present embodiment, a low-pass filter is constituted of the impedance of the PMOS transistor M1 which is one example of an input transistor, and a capacitative element C1. This low-pass filter is constituted in the signal path extending from the input voltage signal VIN to an emitter or a NMOS transistor M2 which is one example of a source follower circuit.

As a result, a bias current I1 is outputted from the constant voltage source IS to the source terminal of the PMOS transistor M1. A voltage signal VX is inputted to the gate terminal of the NMOS transistor M2. This voltage signal VS is obtained by adding the inter-terminal voltage VGS between the gate terminal and source terminal of the PMOS transistor M1, which voltage is one example of the conduction control voltage, to the input voltage signal VIN. If the input voltage signal VIN experiences transient fluctuations to an excessive voltage value, the filter effect becomes active, thereby preventing overshoot of the output voltage VOUT and maintaining the output voltage VOUT to a low voltage.

In this case, if a diode unit D is further provided between the PMOS transistor M1 and the connection point X, the value of the impedance in the signal path extending from the input voltage signal VIN to the NMOS transistor M2 becomes even higher. This makes it possible to maintain the output voltage VOUT to a low voltage with higher reliability.

In applications requiring a low power consumption, if the bias current I1 is set to a low current value, the capacitance value of the capacitative element C1 can be set to a value in the order of picofarad (pF). In an integrated circuit, the area occupied by the capacitative element C1 can be minimized, thereby eliminating the need to specifically ensure provision of such a dedicated area in the circuit.

In the constant voltage circuit and the constant voltage supply system according to the disclosure, the input voltage signal which is inputted to the base terminal or gate terminal of the input transistor is converted to a voltage value which is obtained by carrying out a level shift by a conduction control voltage of a transistor element at an emitter terminal or a source terminal. This conversion is carried out in accordance with a bias current that flows from the constant current source through the emitter terminal or source terminal of the input transistor. Here, the conduction control voltage represents, in a MOS transistor, a voltage between the gate and source at the time a drain current flows, and in a bipolar transistor, a voltage between the base and emitter at the time a collector current flows. In the case of a diode, the conduction control voltage represents a forward voltage. The voltage thus converted is outputted from the emitter or the source follower circuit through the capacitative element.

A low-pass filter is constituted of the impedance of the input transistor and the capacitative element in the signal path extending from the input voltage signal to the emitter or the source follower circuit.

If the input transistor is a P-type transistor such as a PNP bipolar transistor or a PMOS transistor, a bias current is flown from the constant current source to the emitter terminal or source terminal of the input transistor. In this case, a voltage signal is inputted to the emitter or the source follower circuit. This voltage signal is obtained by adding the conduction control voltage to the input voltage signal. If the input voltage signal fluctuates to an excessive voltage value, the impedance value becomes high. As a result, the filter effect provided by the low-pass filter becomes active, thereby preventing overshoot of the output voltage.

If the input transistor is an N-type transistor such as a NPN bipolar transistor or a NMOS transistor, a bias current is flown from the emitter terminal or source terminal of the input transistor towards the constant current source. In this case, a voltage signal is inputted to the emitter or the source follower circuit. This voltage signal is obtained by subtracting the conduction control voltage from the input voltage signal. If the input voltage signal fluctuates to an low voltage value, the impedance value becomes high. As a result, the filter effect provided by the low-pass filter becomes active, thereby preventing undershoot of the output voltage.

A simple circuit element such as a capacitative element is added to the input of the emitter or the source follower circuit in a circuit configuration in which the input voltage signal is subjected to level conversion by a conduction control voltage of the input transistor to obtain the output voltage. As a result, a low pass filter can be inserted in the signal propagation path of the input voltage signal. Transient fluctuations in the voltage of the input voltage signal can thus be suppressed, thereby making it possible to maintain the output voltage to a predetermined voltage. In the constant voltage supply method according to the disclosure, an input voltage signal is inputted to a base terminal or a gate terminal of the input transistor. A bias current flows to the emitter terminal or the source terminal of the input transistor. The input voltage signal is subjected to a level conversion by this bias current in accordance with a conduction control voltage of the input transistor. At this time, a low-pass filter characteristic is provided in the signal path.

As a result, a low-pass filter is constituted of the impedance of the input transistor and the capacitance of the capacitative element in the signal path that extends from the input voltage signal to the emitter or the source follower circuit. This low-pass filter filters fluctuations in the input voltage signal, thereby enabling a stable constant voltage output.

If the input transistor is a P-type transistor such as a PNP bipolar transistor or a PMOS transistor, a bias current is flown from the constant current source to the emitter terminal or source terminal of the input transistor. In this case, a voltage signal is inputted to the emitter or the source follower circuit. This voltage signal is obtained by adding the conduction control voltage to the input voltage signal. If the input voltage signal fluctuates to an excessive voltage value, the impedance value becomes high. As a result, the filter effect provided by the low-pass filter becomes active, thereby preventing overshoot of the output voltage.

If the input transistor is an N-type transistor such as an NPN bipolar transistor or a NMOS transistor, a bias current is outputted from the emitter terminal or source terminal of the input transistor towards the constant current source. In this case, a voltage signal is inputted to the emitter or the source follower circuit. This voltage signal is obtained by subtracting the conduction control voltage from the input voltage signal. If the input voltage signal fluctuates to an low voltage value, the impedance value becomes high. As a result, the filter effect provided by the low-pass filter becomes active, thereby preventing undershoot of the output voltage.

The disclosure is not limited to the above-described embodiments, and, needless to say, various alterations and modifications can be made thereto within the scope and without departing from the spirit of the disclosure.

For instance, the description in the present embodiment concerns the case that a MOS transistor is used as a constituent element. However, the disclosure is not limited to this. Naturally, the circuit configuration can be realized by providing a bipolar transistor, or a MOS transistor and a bipolar transistor together.

Also, the diode unit D was described taking as example a MOS transistor connected to a diode. However, the disclosure is not limited to this. A method to adjust an output voltage VOUT can also be used concurrently by providing a resistive element which is in series with the diode. It is possible to use a bipolar transistor and a diode element whose collector terminals and base terminals are connected. By adding a MOS transistor which is connected to the diode, it is possible to obtain a configuration in which all these terminals are mixed together.

When a NMOS transistor is used in place of the PMOS transistor that receives the input voltage signal and a constant current source is connected to the source terminal of this NMOS transistor, it is possible to obtain a construction in which the output voltage can be maintained at a constant voltage with respect to transient drops in the voltage of the input voltage signal.

According to the disclosure, it is possible to provide a constant voltage circuit, a constant voltage supply system and a constant voltage supply method in which transient fluctuations in voltage caused by fluctuations in the input voltage can be suppressed and which enable output of a stable constant voltage, by using a configuration in which a filter effect is realized in the voltage conversion path for conversion from an input voltage to an output voltage.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A constant voltage circuit comprising:
an input transistor that receives an input voltage signal supplied by a bandgap reference circuit at a gate terminal;
a constant current source that outputs a bias current with respect to a source terminal of the input transistor, the constant current source being coupled to a current mirror circuit that provides the bandgap reference circuit with a bias current;
a capacitative element having one terminal coupled to a path that couples the input transistor and the constant current source; and
a source follower circuit that receives a voltage signal generated at the one terminal of the capacitative element,
wherein at least one diode is provided in a path that couples the input transistor and the constant current source and leads from the input transistor to the capacitative element.

2. The constant voltage circuit according to claim 1 wherein another terminal of the capacitative element is coupled to one of a source voltage and a ground voltage.

3. The constant voltage circuit according to claim 1 wherein the at least one diode includes a diode-connected transistor.

4. A constant voltage supply system that supplies a predetermined voltage to a later stage circuit, comprising:
a voltage supply unit that supplies an input voltage signal, the voltage supply unit including a bandgap reference circuit;
an input transistor that receives the input voltage signal at a gate terminal;
a constant current source that outputs a bias current with respect to a source terminal of the input transistor, the constant current source being coupled to a current mirror circuit that provides the bandgap reference circuit with a bias current;
a capacitative element having one terminal coupled to a path that couples the input transistor and the constant current source; and
a source follower circuit that receives voltage signal generated at the one terminal of the capacitative element, the source follower circuit being adapted to supply a predetermined voltage to the later stage circuit,
wherein at least one diode is provided in a path that couples the input transistor and the constant current source and leads from the input transistor to the capacitative element.

5. A constant voltage supply method:
inputting an input voltage signal supplied by a bandgap reference circuit to a gate terminal of an input transistor;
outputting a bias current with respect to a source terminal of the input transistor, the bias current being generated based on a current mirror circuit that provides the bandgap reference circuit with the bias current;
converting a level of the input voltage signal by the bias current, in accordance with a conduction control voltage of the input transistor and a forward voltage of a diode provided in a signal path of the bias current; and
providing a low-pass filter characteristic to a signal path when converting the level.

6. The constant voltage supply method according to claim 5, wherein the conduction control voltage includes an inter-terminal voltage between a gate terminal and a source terminal at a time a drain current flows in a MOS transistor.

7. A constant voltage circuit comprising:
an input transistor that receives an input voltage signal supplied by a bandgap reference circuit at a base terminal;
a constant current source that outputs a bias current with respect to an emitter terminal of the input transistor, the constant current source being coupled to a current mirror circuit that provides the bandgap reference circuit with a bias current;
a capacitative element having one terminal coupled to a path that couples the input transistor and the constant current source; and
an emitter follower circuit that receives a voltage signal generated at the one terminal of the capacitative element,
wherein at least one diode is provided in a path that couples the input transistor and the constant current source and leads from the input transistor to the capacitative element.

8. The constant voltage circuit according to claim 7 wherein another terminal of the capacitative element is coupled to one of a source voltage and a ground voltage.

9. The constant voltage circuit according to claim 7 wherein the at least one diode includes a diode-connected transistor.

10. A constant voltage supply system that supplies a predetermined voltage to a later stage circuit, comprising:
a voltage supply unit that supplies an input voltage signal, the voltage supply unit including a bandgap reference circuit;
an input transistor that receives the input voltage signal at a base terminal;

a constant current source that outputs a bias current with respect to an emitter terminal of the input transistor, the constant current source being coupled to a current mirror circuit that provides the bandgap reference circuit with a bias current;

a capacitative element having one terminal coupled to a path that couples the input transistor and the constant current source; and an emitter follower circuit that receives a voltage signal generated at the one terminal of the capacitative element, the emitter follower circuit being adapted to supply a predetermined voltage to the later stage circuit, wherein at least one diode is provided in a path that couples the input transistor and the constant current source and leads from the input transistor to the capacitative element.

11. A constant voltage supply method:

inputting an input voltage signal supplied by a bandgap reference circuit to a base terminal of an input transistor;

outputting a bias current with respect to an emitter terminal of the input transistor, the bias current being generated based on a current mirror circuit that provides the bandgap reference circuit with the bias current;

converting a level of the input voltage signal by the bias current, in accordance with a conduction control voltage of the input transistor and a forward voltage of a diode provided in a signal path of the bias current; and providing a low-pass filter characteristic to a signal path when converting the level.

12. The constant voltage supply method according to claim 11, wherein the conduction control voltage includes an inter-terminal voltage between a base terminal and an emitter terminal at a time a collector current flows in a bipolar transistor.

13. The constant voltage circuit according to claim 1 further comprising another capacitative element having one terminal coupled to a source terminal of the source follower circuit.

14. The constant voltage supply system according to claim 4 further comprising another capacitative element having one terminal coupled to a source terminal of the source follower circuit.

* * * * *